United States Patent
Ventzek et al.

(10) Patent No.: US 10,249,498 B2
(45) Date of Patent: Apr. 2, 2019

(54) METHOD FOR USING HEATED SUBSTRATES FOR PROCESS CHEMISTRY CONTROL

(71) Applicant: Tokyo Electron Limited, Minato-ku, Tokyo (JP)

(72) Inventors: Peter L. G. Ventzek, Austin, TX (US); Hirokazu Ueda, Kofu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 200 days.

(21) Appl. No.: 15/099,031

(22) Filed: Apr. 14, 2016

(65) Prior Publication Data
US 2016/0372327 A1 Dec. 22, 2016

Related U.S. Application Data

(60) Provisional application No. 62/182,260, filed on Jun. 19, 2015.

(51) Int. Cl.
H01L 21/223 (2006.01)
H01L 21/02 (2006.01)
H01L 21/324 (2006.01)

(52) U.S. Cl.
CPC .... *H01L 21/2236* (2013.01); *H01L 21/02057* (2013.01); *H01L 21/324* (2013.01)

(58) Field of Classification Search
CPC .................................................. H01L 21/223
See application file for complete search history.

(56) References Cited

U.S. PATENT DOCUMENTS

| | | | | |
|---|---|---|---|---|
| 6,479,390 B1 * | 11/2002 | Lee | .................. | H01J 37/32192 |
| | | | | 257/E21.252 |
| 2006/0264051 A1 * | 11/2006 | Thibaut | ............. | H01L 21/02052 |
| | | | | 438/690 |
| 2010/0167507 A1 * | 7/2010 | Horigome | ......... | H01J 37/32412 |
| | | | | 438/513 |

OTHER PUBLICATIONS

H. Ueda, et al., "Conformal doping of topographic silicon structures using a radial line slot antenna plasma source," Journal of Applied Science, 115, pp. 214904-1-214904-8, (2014).

H. Ueda, et al., "Mechanisms for dose retention in conformal arsenic doping using a radial line slot antenna microwave plasma source," Journal of Applied Science, 117, pp. 224904-1-224904-7, (2014).

K. Kuhn, "Considerations for Ultimate CMOS Scaling," IEEE Transactions on Electron Devices, vol. 59, No. 7, pp. 1813-1828, Jul. 2012.

M. Kwong, "Impact of Extension Lateral Doping Abruptness on Deep Submicron Device Performance," Dissertation, 241 pp., 2002.

M. Liu, et al., "Effect of Gate Overlap and Source/Drain Doping Gradient on 10-nm CMOS Performance," IEEE Transactions on Electron Devices, vol. 53, No. 12, Dec. 2006.

(Continued)

*Primary Examiner* — Marvin Payen
(74) *Attorney, Agent, or Firm* — Rothwell, Figg, Ernst & Manbeck, P.C.

(57) ABSTRACT

A method of controlling doping of a substrate, the method comprising: providing the substrate in a process chamber of a doping system; performing a doping process to impart a target dose on a surface of the substrate using a abruptness depth control technique; and controlling selected operating variables of plasma doping in order to meet doping objectives.

17 Claims, 12 Drawing Sheets

(56) References Cited

OTHER PUBLICATIONS

H. Miyoshi, et al., "Microwave plasma doping: Arsenic activation and transport in germanium and silicon," Japanese Journal of Applied Physics, 55, pp. 04EB05-1-04EB05-6, (2016).
Table ORTC1, "Summary 2013 ORTC Technology Trend Targets," The International Technology Roadmap for Semiconductors, 2013.
P. Ventzek, et al., "Formation, nature, and stability of the arsenic-silicon-oxygen alloy for plasma doping of non-planar silicon structures," Applied Physics Letters, 105, pp. 262102-1-262102-5, 2014.
T. Tsutsumi, et al., "Study of threshold voltage fluctuation caused by source and drain extensions doping variation of tri-gate fin-type FET using three-dimensional device simulation," Japanese Journal of Applied Physics, 53, pp. 06JE06-1-06JE06-6, 2014.

* cited by examiner

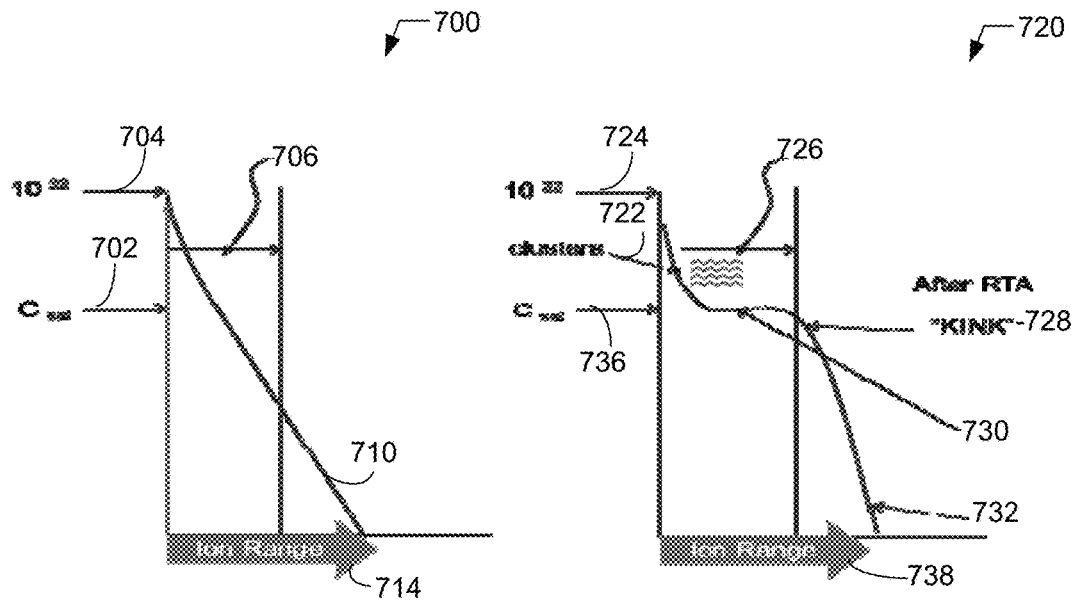
FIG. 7A Prior Art
FIG. 7B Prior Art
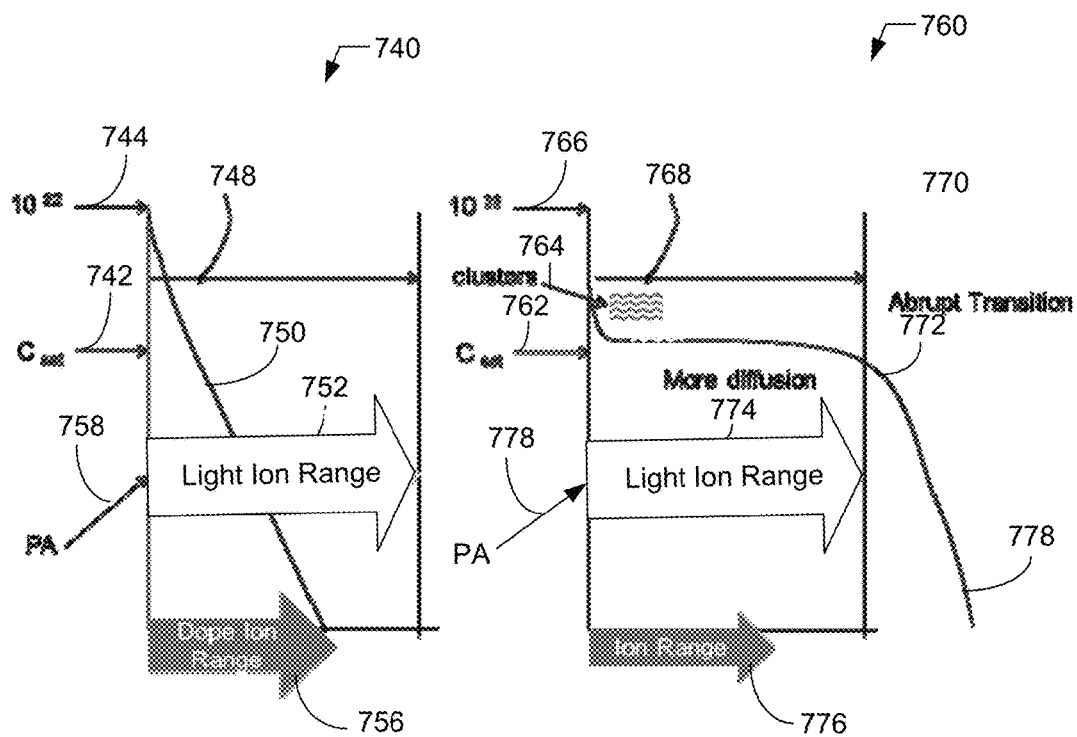
FIG. 7C
FIG. 7D

METHOD FOR USING HEATED SUBSTRATES FOR PROCESS CHEMISTRY CONTROL

CROSS-REFERENCE TO RELATED APPLICATIONS

Pursuant to 37 C.F.R § 1.78(a)(4), this application claims the benefit of and priority to U.S. Provisional Application No. 62/182,260, filed Jun. 19, 2015, which is expressly incorporated by reference herein in its entirety.

FIELD OF THE INVENTION

This disclosure is related to methods and systems for processing a substrate and more specifically, for a method and system for using heated substrates for process chemistry control in atomic layer deposition and atomic layer etching.

BACKGROUND OF THE INVENTION

Heated substrate doping is a focus of doping process development for advanced large scale integration (LSI) fabrication. An example is ion implantation on heated substrates. While thermal management of beam implant doping profiles is becoming well established, the absence of a clear mechanism for surface reactions and solid state chemistry for thermal assisted plasma processing (radical assisted plasma doping, atomic layer deposition (ALD) and atomic layer etching (ALE)) has hindered its adoption.

Advances in metrology and computational methods have recently provided more insight into how solid state surface chemistry can be controlled. Plasma doping technology is successful because of how additives, dopants and ions can be controlled. In the ALD, a means of predicting dopant incorporation and film properties such as damage density would allow the development of methods for their construction.

Doping is conventionally performed by substrate damage assisted and materially benign processes. Damage assisted includes ion implantation where very high energy ions are thrown at a surface either by a beam or through the assistance of a plasma source in contact with the substrate. Laser methods are also used to melt the surface and mix dopants and substrates. Benign methods include solid state doping, liquid phase doping that in effect involve the deposition of a film that is infused using heat or another form of energy. Plasma doping is a non-damaging hybrid whereby radical dopants are infused aided by conventionally low energy ions and film formation. Electrical activation in all methods includes a form of annealing with thermal energy.

Silicon doping of fins, for example, benefits perfectly from plasma doping (excluding plasma source ion implantation (PIII) technology) in that shallow high dose damage free dose is possible. Germanium and Group III-V implant requirements are that both deep (not shallow) high dose (dopant) profiles can be imparted into a substrate with an abrupt transition. There is a need for concurrent control of both plasma-surface interactions and the thermal materials chemistry of the surface and near surface of the substrate. For example, Group III-V material implant is but one example of a materials system that would benefit from concurrent control of variables mentioned above. In addition to electrical activation (doping), surface and near surface chemistry control is needed for precise nano-layer deposition and nano-scale etch processes. Furthermore, there is a need for processes that can meet doping objectives including damage density, amorphization depth, and transition abruptness of the doping profile.

SUMMARY OF THE INVENTION

A method of controlling doping of a substrate, the method comprising: providing the substrate in a process chamber of a doping system; performing a doping process to impart a target dose on a surface of the substrate using a abruptness depth control technique; and controlling selected operating variables of plasma doping in order to meet doping objectives.

Also provided is a method of controlling doping of a substrate, the method comprising: providing the substrate in a process chamber of a doping system; performing a plasma doping process to impart a deep dose on a surface of the substrate by facilitating diffusion of doping radicals but with low enough current so that the surface of the substrate is not sputtered; performing an oxidizing clean process on the substrate; and performing an annealing process on the substrate; wherein the plasma doping process is controlled to meet doping objectives.

Also provided is a doping system configured to perform thermal management of the substrate for interface solid state chemistry control, the system comprising: an ion source configured to generate ion species; biased electrodes coupled to the ion source; means for accelerating selected ion species; a process chamber configured to hold a substrate for doping; a heater coupled to the process chamber, the heater configured to apply heat to the substrate while a doping process is being performed on the substrate; and a controller coupled to the biased electrodes, the means for accelerating the selected ion species, the heater, and the process chamber, the controller configured to control selected operating variables in order to meet doping objectives.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention:

FIG. 5A is an exemplary graph 500 of the growth rate of the doped layer as a function of inverse temperature whereas

FIG. 7A is an exemplary prior art graph 700 where the species concentration versus the depth of the layer prior to rapid thermal annealing (RTA) whereas FIG. 7B is an exemplary prior art graph 720 of the dopant species concentration versus the depth of the layer after RTA;

FIG. 7C is an exemplary graph 740 of the dopant species concentration versus the depth of the layer without rapid thermal annealing (RTA) whereas FIG. 7D is an exemplary graph 760 of the dopant species concentration versus the depth of the layer after RTA with a pre-amorphization step;

DETAILED DESCRIPTION OF EMBODIMENTS OF THE INVENTION

Figure 1:
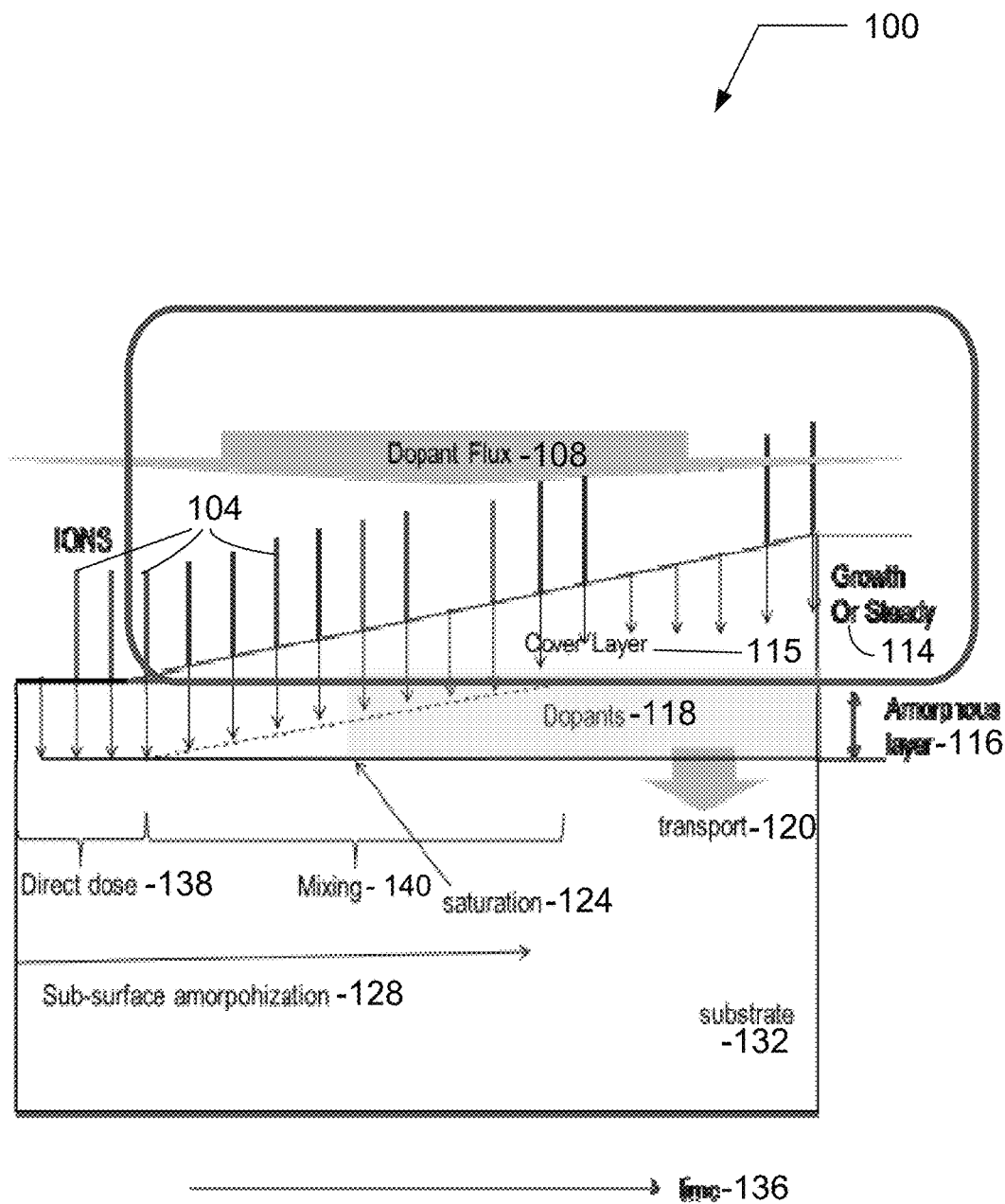
FIG. 1 is an exemplary schematic 100 of areas above a substrate in a process chamber of a doping system in an embodiment of the present invention.

Solid state source introduction of dopants and additives for a plasma doping process are disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "radiation sensitive material" means and includes photosensitive materials such as photoresists.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide.

Switching to the figures, FIG. 1 is an exemplary schematic 100 of areas above a substrate in a process chamber of a doping system in an embodiment of the present invention. The dopant flux 108 above the substrate 132 is shown as a function of time 136. Displayed on the left side of the schematic 100 are the ions 104 generated by the surface wave device striking the surface of the substrate 132 in a direct dose time period 138. The dopant flux 108 exposes the surface of the substrate 132 during the mixing time period 140. Over time, an amorphous layer 116 in the cover layer 115 above the top of the substrate 132 at the same time a heat source (not shown) will enable sub-surface amorphization 128 of a layer of the substrate, reaching a saturation point 124 and a growth and steady phase 114 of the doping process is reached. The temperature of the substrate 132 provides the energy needed to transport the dopants 118 into the crystalline layer in the direction of the amorphous layer of the substrate 132 by diffusion transport 120.

Figure 2A:
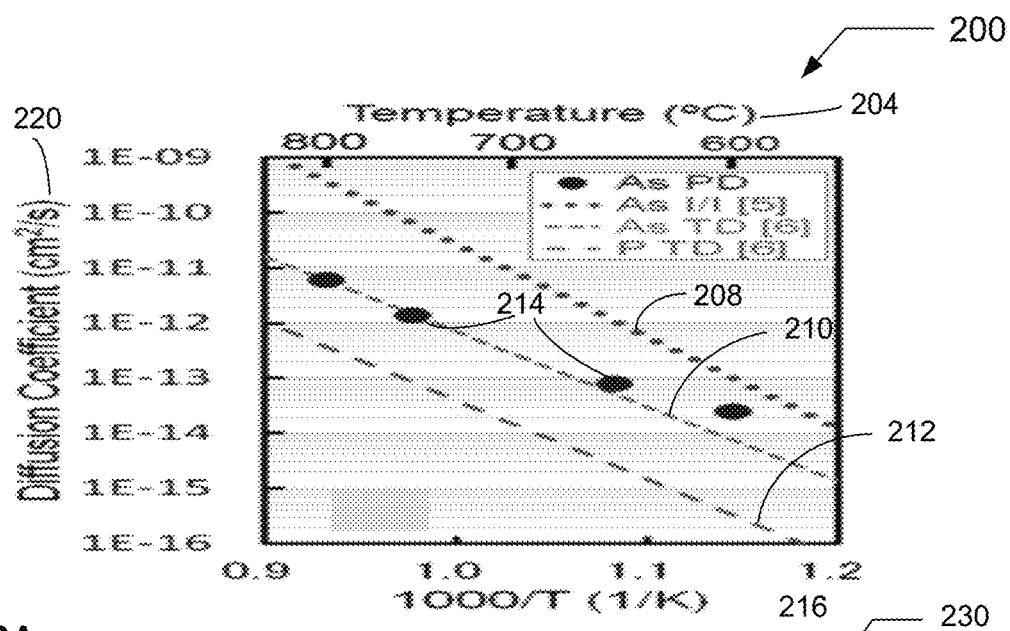
FIG. 2A is an exemplary graph 200 of the diffusion coefficient in $cm^2/s$ as a function of the inverse of absolute temperature of the substrate.

FIG. 2A is an exemplary graph 200 of the diffusion coefficient in cm$^2$/s as a function of the inverse of absolute temperature of the substrate for different dopants, doping processes and surface conditions. The black dots 214 represent arsenic (As) as the plasma doping material showing the diffusion coefficients as a function of substrate temperature in degrees C. in the top X-axis 204. A corresponding inverse of the temperature converted to absolute temperature is shown in the bottom X-axis. Two other curves 208 and 210 show other versions of arsenic as the dopant element comprising ion implantation and thermal diffusion. Another curve 212 shows phosphorus (P) as the dopant element with its corresponding diffusion coefficients as a function of the temperature of the substrate for thermal diffusion.

Figure 2B:
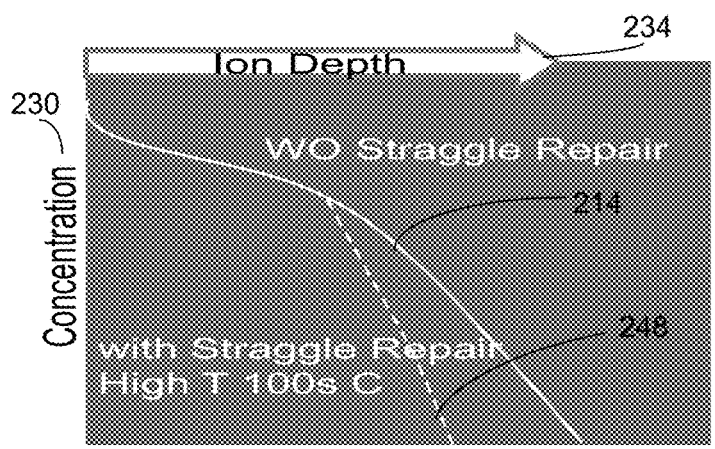
FIG. 2B is an exemplary graph 230 of the concentration of radicals as a function of ion depth with straggle repair versus without straggle repair.

FIG. 2B is an exemplary graph 230 of the concentration of radicals as a function of ion depth with straggle repair versus without straggle repair. The Y-axis is the concentration of the radicals, while the top X-axis is the ion depth 234 and the bottom X-axis is the depth that ion has penetrated the layers of the substrate. The top solid curve 214 is the curve without straggle repair. The lower dotted-line curve 248 shows the variation of the curve when straggle repair is used with a high temperature in the substrate.

Figure 2C:
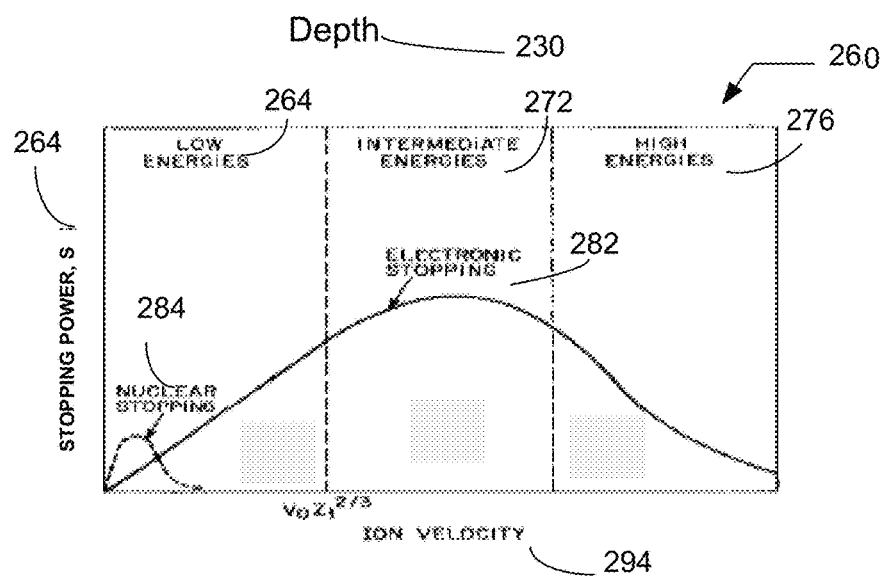
FIG. 2C is an exemplary graph 260 of the stopping energy versus the ion velocity where nuclear stopping typically happens at low energies of the ion flux.

FIG. 2C is an exemplary graph 260 of the stopping energy versus the ion velocity where nuclear stopping typically happens at low energies of the ion flux. The X-axis 294 is the ion velocity and the Y-axis is the stopping power 264. The penetration depth of a flux of ions is determined by the stopping power. At low energies 264, the stopping of the ion flux can be nuclear stopping and at intermediate energies 272 can be electronic stopping 282. The damage density may be limited by the time an overlying film can be deposited by dopant radicals and other species (oxygen, silicon, Ga, or Ge and others) that limit the penetration depth of ions. For low energy ions that penetrate only a monolayer or two, a surface layer may be amorphized in seconds. The amorphization time t can be calculated using the following equation:

$$t = \frac{\Gamma}{\tilde{n}} \qquad \text{Equation 1.1}$$

where $\Gamma$ is the ion flux and n(tilde) is the surface site density (typically 1015 cm-2). For any low temperature plasma, the ion flux is on the order of or exceeds 1015 cm−2 s−1. A rough estimate of the time to disorder deeper layers can be calculated using the following equation:

$$t = \frac{\Gamma}{N\tilde{n}} \qquad \text{Equation 1.2}$$

where N is the number of layers. Even for 40 or 50 layers, the timescale is brief (seconds order or less). At higher energies, the damage process is more complicated as ions can displace multiple substrate atoms with levels of effectiveness that depend on the instantaneous ion energy and history of the sample.

The density of dopant in the substrate can be calculated using the following equation:

$$C_{dopant} = \frac{\Gamma_{radical\_flux}}{\langle \delta \rangle} t^* \qquad \text{Equation 1.3}$$

where C is the concentration of dopant, $\Gamma$ is the radical flux, and $\langle \delta \rangle$ is an amorphous depth. The amorphous depth is defined as the depth where the defect density is approximately 1/10th of the solid state density. The layer is saturated when C dopant is greater than or equal to C saturation or $C_{SAT}$ which is the saturation concentration of the amorphized layer. When this concentration is achieved a film is deposited over the damaged layer or dopant may not "stick". The cover layer is important for limiting further damage and may be achieved post saturation or by co-depositing other species such as oxygen or silicon.

The solid state chemistry of the supersaturation layer and interface is very important. In the case of doping, its nature provides for the ability to serve high dose in a conformal means to topographic structures. The nature of the film is determined by its solid state thermochemistry. The thermochemistry of the film is determined by temperature and stoichiometry. This invention is a means of controlling the nature of this layer, interface and substrate.

Figure 3A:
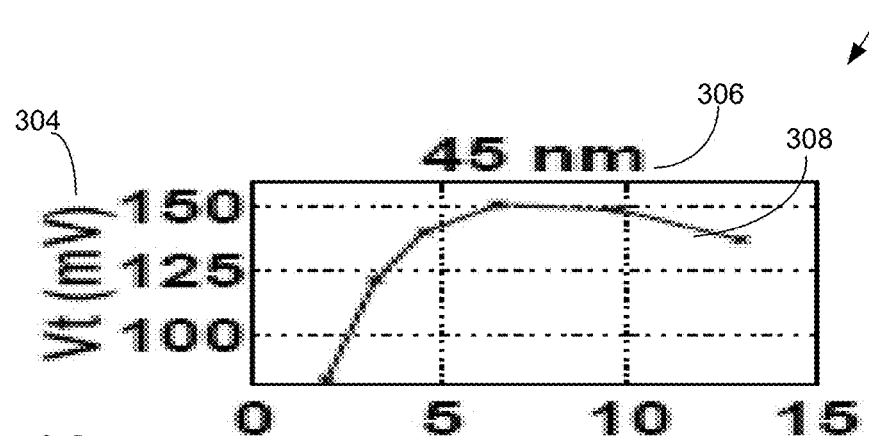
FIG. 3A is an exemplary graph 300 of the voltage threshold at 45 nm as a function of time.
Figure 3B:
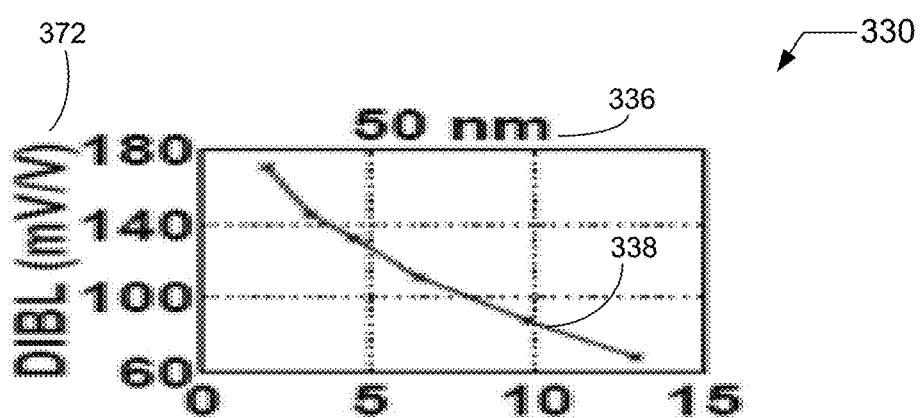
FIG. 3B is an exemplary graph 330 of the drain induced barrier lowering (DIBL) at 50 nm as a function of time.
Figure 3C:
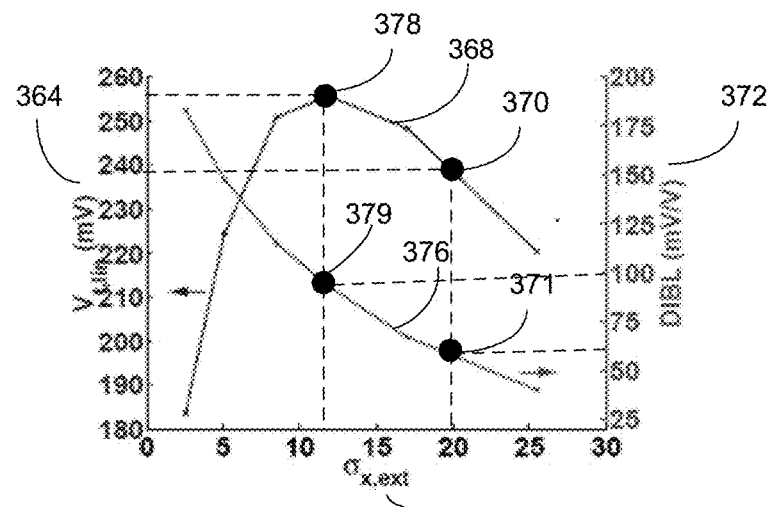
FIG. 3C is an exemplary graph 360 of the voltage threshold on the left Y-axis and DIBL on the right Y-axis and time in the X-axis, the graphs highlighting the trade-offs.

FIG. 3A is an exemplary graph 300 that includes a curve 308 of the voltage threshold $V_T$ at 45 nm 306 as a function of abruptness (with units of nm/decade of dopant concentration, where decade means $1^{10}$, that is, 1 to the power of 10) while FIG. 3B is an exemplary graph 330 that includes a curve 338 of the drain induced barrier lowering (DIBL) at 50 nm 336 as a function of abruptness (with units of nm/decade of dopant concentration); and FIG. 3C is an exemplary graph 360 that includes a curve 368 of the voltage threshold on the left Y-axis 364 and DIBL on the right Y-axis 372 and characteristic dopant Gaussian spread (with units of nm) in the X-axis 384, the graphs that includes curve 376 highlighting the trade-offs between $V_T$ and DIBL. Although an abrupt profile of the doping depth is typically favored, there is a tradeoff of where higher $V_T$ can also cause an increase in DIBL. For example, when the amorphous depth δ is at about 20 nm, the value of $V_T$ at point 370 is about 240 mV and the DIBL at point 371 is about 60 mV/V. When $V_T$ rises to the maximum value at point 378 with a value of amorphous depth δ of about 11 nm, $V_T$ is about 256 mV, the DIBL at point 379 is about 100 mV/V.

Figure 4A:
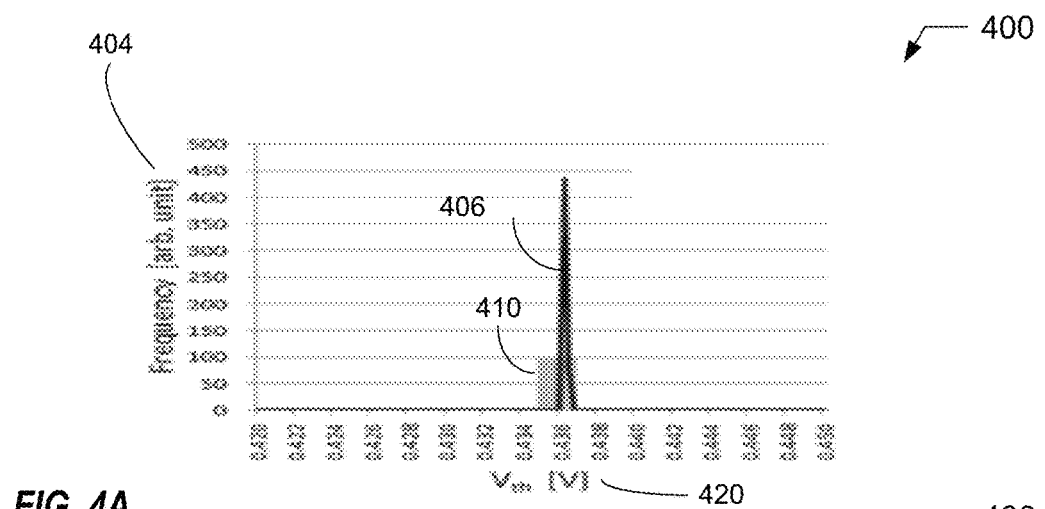
FIG. 4A, FIG. 4B, and FIG. 4C are exemplary graphs 400, 430, and 460 of the frequency (arbitrary units) of occurrence versus voltage threshold that highlights that radical profile and abruptness of the transition from high to low radical concentration impacting device variability.
Figure 4B:
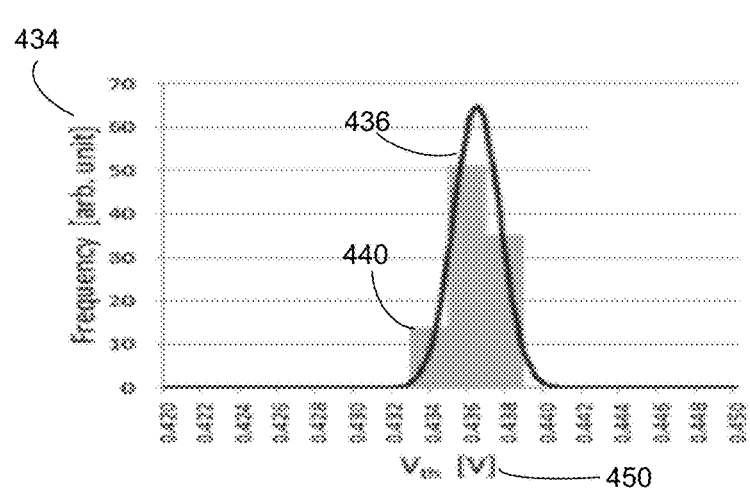
Figure 4C:
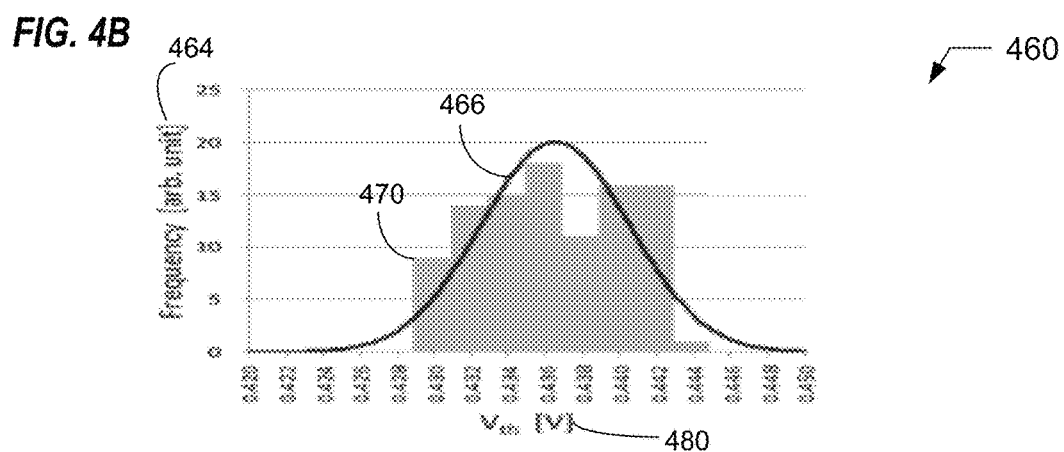

FIG. 4A, FIG. 4B, and FIG. 4C are exemplary graphs 400, 430, and 460 of the distribution of voltage thresholds characterized by frequency of occurrence (arbitrary units) versus threshold voltage and highlights that radical profile and abruptness of the transition from high to low radical concentration impact device variability. The X-axis in all the graphs is 420, 450, and 480 is the threshold voltage labelled as $V_{th}$ and the Y-axis in all the graphs is the frequency (arbitrary unit) 404, 454, and 464. FIG. 4A is an exemplary graph 400 of the frequency threshold voltage $V_{th}$ that shows a small spread as a result of depth variation as is apparent in the histogram 410 and in the normalized curve 406. FIG. 4B is an exemplary graph 430 of the frequency threshold voltage $V_{th}$ that shows the peak density depth variation as is apparent in the histogram 440 and in the normalized curve 436 has a small impact on $V_t$ variations. FIG. 4C is an exemplary graph 460 of the frequency threshold voltage $V_{th}$ that shows a big spread of $V_t$ variation as is apparent in the histogram 470 and in the normalized curve 466 as a function of the characteristic variation of the spreading of dopant concentration.

Figure 5A:
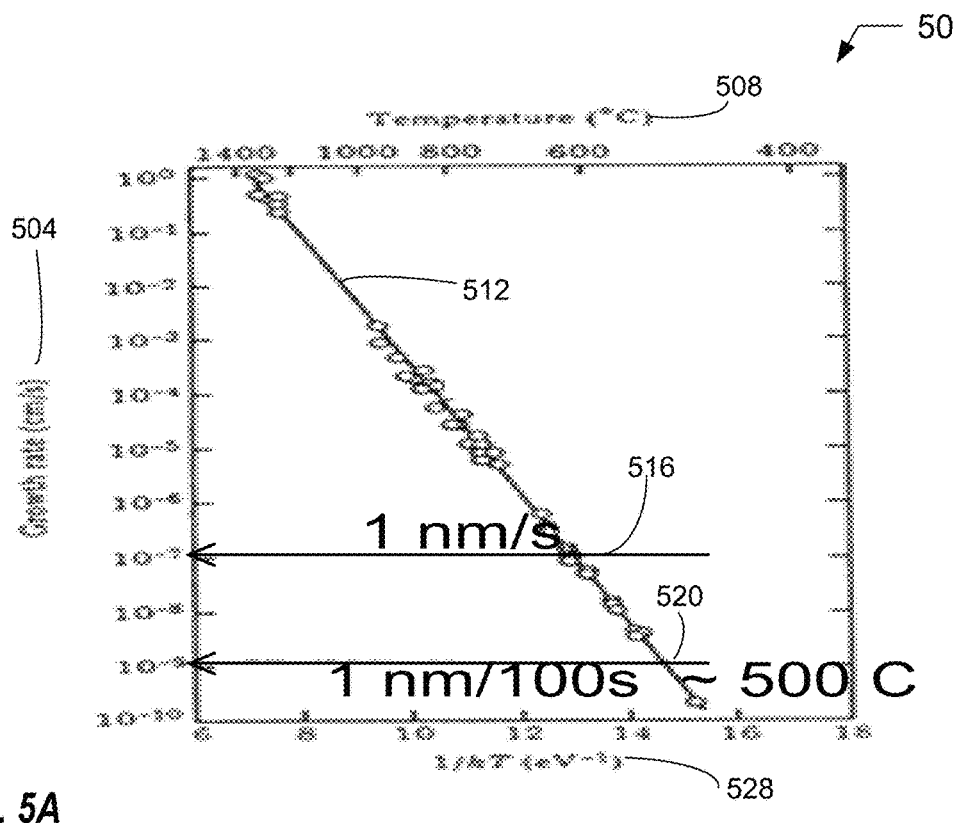

FIG. 5A is an exemplary graph 500 of the growth rate of a repaired (amorphous to crystalline front movement) doped layer as a function of the inverse of the temperature. Two growth rates, time derivatives of the repair front position, 1 nm/s and 1 nm/100 s, highlight typical process limits. The top X-axis 508 is the temperature in degrees C. The bottom X-axis 528 is expressed the inverse of temperature 1/kT (eV$^{-1}$) where k is the Boltzmann's constant. The Y-axis is the growth rate of the repaired doped layer in cm/s where repair indicates a transition from an amorphous or damaged to a crystalline substrate nature. The curve 512 provides a linear best fit approximation of the ion penetration depth to infuse the radicals to the desired depth. The top line arrow 516 indicate that $10^{-7}$ is equivalent to 1 nm per second and the bottom line arrow 520 indicate that $10^{-9}$ is equivalent to 1 nm per 100 s at about 500 degrees C.

Figure 5B:
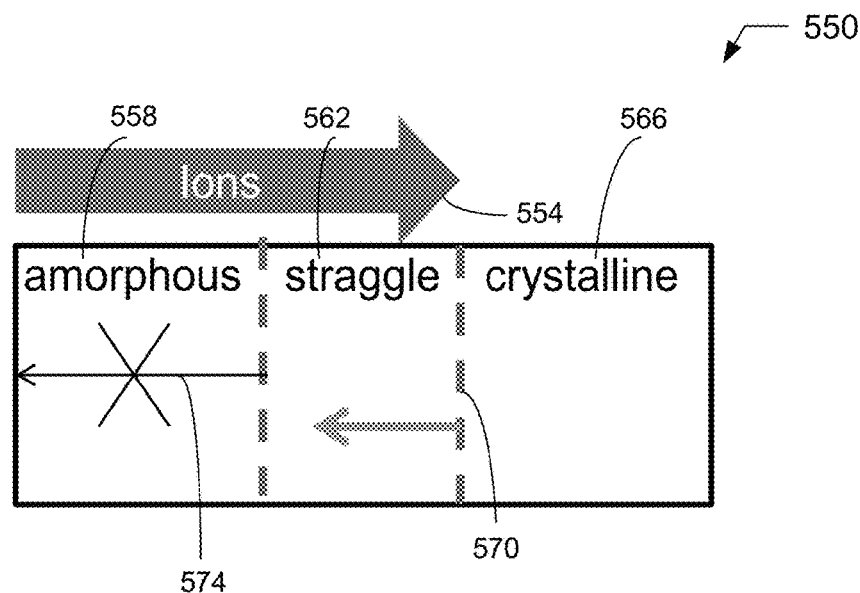
FIG. 5B is diagram 550 of the direction 574 of the crystalline-amorphous surface during solution repair straggle where the crystalline-amorphous surface can be moved but not all the way to the surface of the substrate.

FIG. 5B is an exemplary schematic 550 of the direction of the crystalline-amorphous surface 570 when straggle repair is performed where the crystalline-amorphous surface 570 can be moved but not all the way to the surface of the substrate 568. The layers near the surface of the substrate 568 include the amorphous layer 558, the straggle layer 562, and the crystalline layer 566. Ions 554 generate the amorphous and straggle layers. Repairing the straggle layer 562 includes moving the crystalline-amorphous surface 570 towards the amorphous top layer but not all the way.

Figure 6:
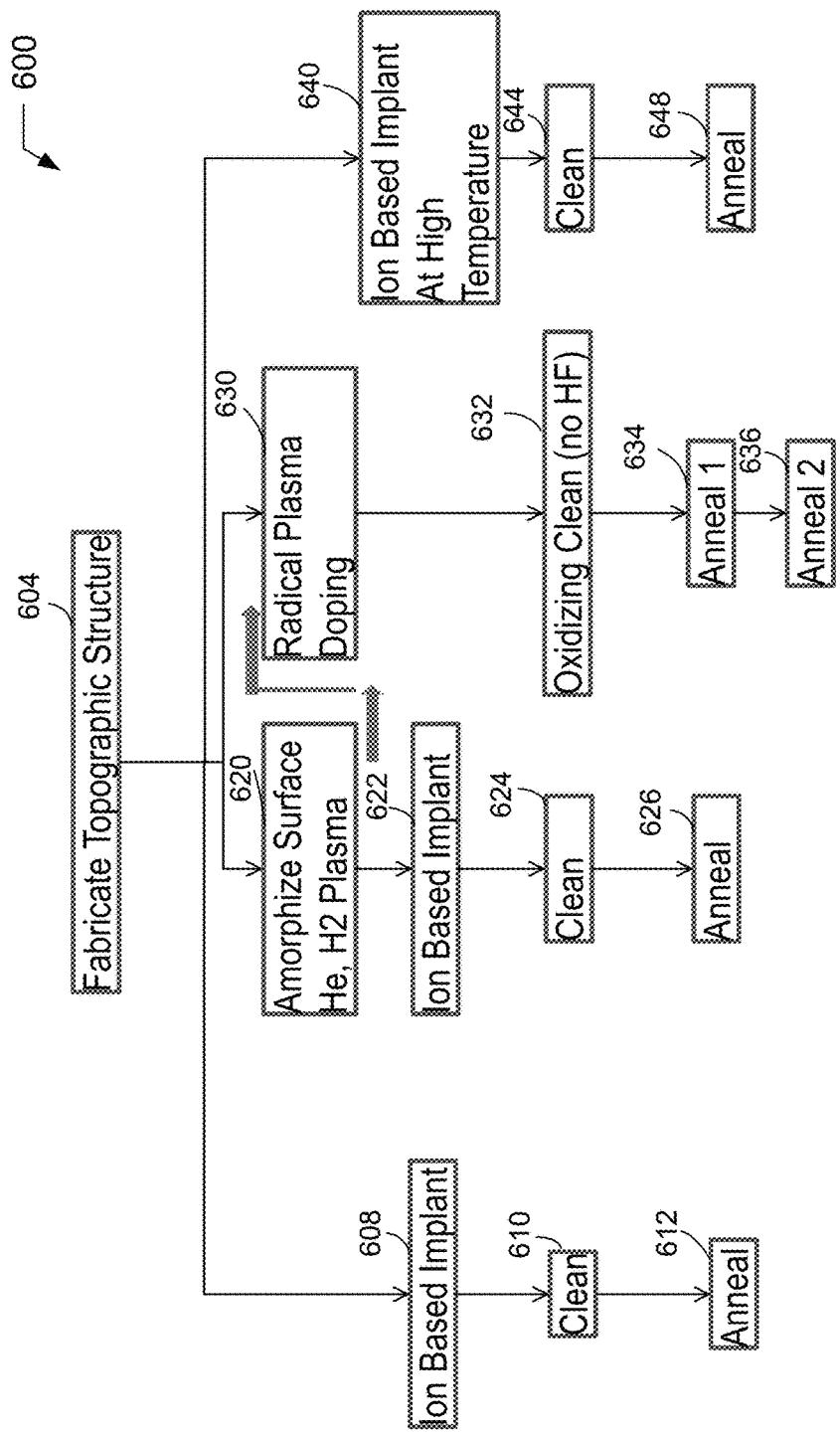
FIG. 6 Prior Art is a chart 600 of various approaches that have been used to perform the doping processes.

FIG. 6 Prior Art is a hierarchical chart 600 of where various techniques have been used to perform the doping processes. The first step 604 of the method is to fabricate the topographic structure. There are four techniques in prior art to solving the challenges for doping. The first technique starts with a step 608 to fabricate an ion-based implant which is cleaned 610 and annealed 612. The second technique adds new step 620 of amorphizing the surface with He or H2 plasma, then a similar step 622 to fabricate the ion-based implant, which is cleaned 624 and annealed 626.

The third technique includes also a new step 630 of doping the substrate with a radical plasma, a step 632 performing an oxidizing clean (but not using a hydrofluoric (HF) acid clean, followed by a first anneal step 634 and second anneal step 636. The substrate processed in an amorphizing surface step 620 with either He or H2 plasma can also be processed to completion using the third technique. The fourth technique starts with a step 640 of fabricating an ion-based implant at high temperature. Then, the substrate is cleaned 644 and annealed 648.

The following definitions apply to subsequent figures. C saturation or $C_{SAT}$ is the equilibrium saturation density of a dopant in the substrate material for a given temperature, i.e., the maximum naturally infused concentration of a dopant into a solid. A $10^{22}$ is the dopant density in units of a cubic centimeter, $cm^3$.

FIG. 7A is a prior art exemplary graph 700 depicting a conventional implant profile highlighting the species concentration versus the depth of the layer prior to rapid thermal annealing (RTA). The $10^{22}$ dopant density 704 and $C_{SAT}$ 702 are depicted as stated in prior art for high dose conditions. The amorphization depth 706 is the conventional depth at which ions fully disorder in a substrate and the profile 710 is basically an almost straight down-sloping line terminating close to the ion range 714 when the concentration is plotted on a log(y-axis) linear (depth) plot.

FIG. 7B is a prior art exemplary graph 720 depicting the implant profile highlighting the dopant species concentration versus the depth of the layer after RTA. The $10^{22}$ peak dopant density 724 and $C_{SAT}$ 736 are depicted as stated in prior art. The dopant penetration depth 726 is longer than the amorphization depth 706 prior to RTA in FIG. 7A. The profile 732 includes clusters 722 of the dopant close to surface of the substrate. The profile 732 also includes a leveling 730, a kink 728 followed by a down-sloping line terminating beyond the ion range 738.

FIG. 7C is an exemplary graph 740 depicting the implant profile with a pre-amorphization step and prior to RTA. The $10^{22}$ peak dopant density 744 and $C_{SAT}$ 742 steps are shown. The pre-amorphization (PA) 758 step is a part of the plasma doping process (discussed below) performed using light ions and depicted as light ion range 752 which causes the amorphization depth 748 to be longer than those previously achieved in prior art. The implant profile includes a downward sloping line 750 terminating close to the end of the dope ion range 756. The light ion used include helium or argon ions.

FIG. 7D is an exemplary graph 760 depicting the implant profile after RTA with a pre-amorphization step. The $10^{22}$ peak dopant density 766 and $C_{SAT}$ 762 steps are shown. The pre-amorphization (PA) 778 step is performed to cause a light ion range mediated dopant 774 diffusion. The result is that the amorphization depth 768 is longer than previously achieved in prior art. The profile 778 include a portion of the line that goes down quickly close to the clusters 764 and abruptly levels out before an abrupt transition 772 followed by a gently downward sloping line terminating some distance from the end of the ion range 776 and the light ion range 774.

Figure 8A:
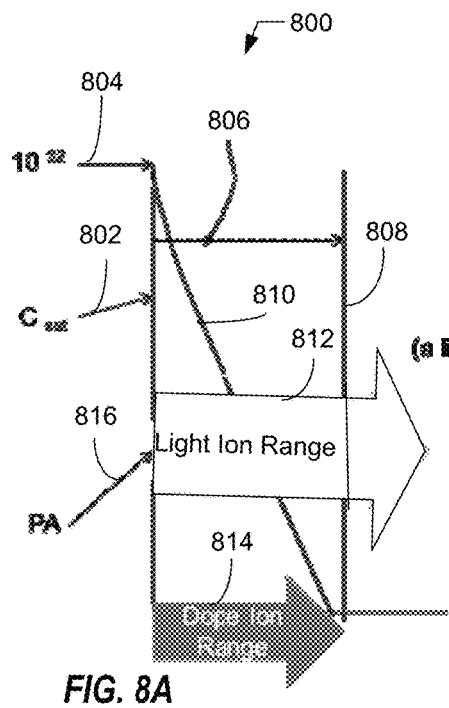
FIG. 8A and FIG. 8B are exemplary graphs 800 and 820 that highlight the importance of the ranges of pre-amorphization as can be seen in the increased abruptness in FIG. 8B.
Figure 8B:
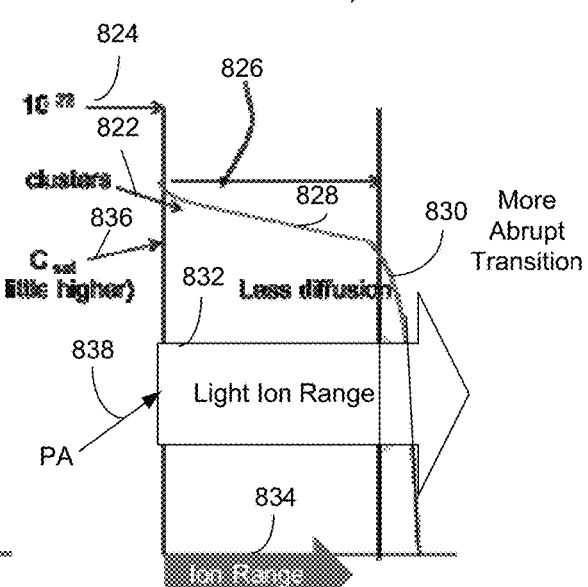

FIG. 8A and FIG. 8B are exemplary graphs 800 and 820 that highlight the importance of the ranges of pre-amorphization as can be seen in the increased abruptness of the profile in FIG. 8B.

FIG. 8A is an exemplary graph 800 depicting the implant profile before RTA with a pre-amorphization (PA) step. The $10^{22}$ peak dopant density 804 and $C_{SAT}$ 802 steps are shown. The pre-amorphization (PA) 816 step is performed to cause a light ion range 812 diffusion. The result is that the amorphization depth 806 is longer than previously achieved in prior art. In addition, the implant profile 810 include a portion of the line that includes a downward sloping line terminating close to the end of the dope ion range 814 highlighting increased abruptness in the profile compared to current art.

FIG. 8B is an exemplary graph 820 depicting the implant profile after RTA with a pre-amorphization step. The $10^{22}$ peak dopant density 824 and $C_{SAT}$ 836 steps are shown. The pre-amorphization (PA) 838 step is performed to cause a light ion range 832 with less diffusion. The result is that the amorphization depth 826 is longer than previously achieved in prior art. The implant profile 828 includes a portion of the line that goes down quickly close to the clusters 822 and abruptly levels out before an abrupt transition 830 followed by a downward sloping line terminating some distance from the end of the ion range 834. The result is a profile that has a more abrupt transition and some of the clusters 822 can dissolve and the damage can be repaired.

Figure 8C:
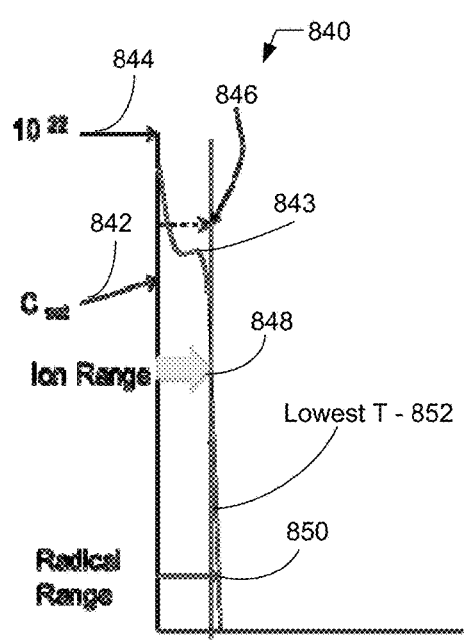
FIG. 8C and FIG. 8D are exemplary graphs 840 and 860 that highlights the sharpening of the abruptness by heating the substrate and moving the crystal-amorphous interface closer to the surface of the substrate.
Figure 8D:
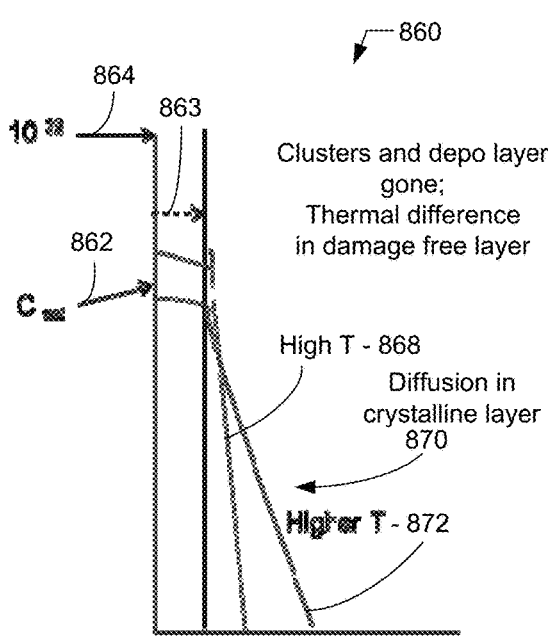

FIG. 8C and FIG. 8D are exemplary graphs 840 and 860 that highlight the sharpening of the abruptness profile by heating the substrate (not shown) and moving the crystal-amorphous interface closer to the surface of the substrate. "Damageless" plasma is a plasma that does not create deep damage on a functional surface being processed, for example, defects, sputtering, amorphization, or charging effects. In damageless plasma doping, a hot chuck or heating device is used to control the saturation layer, remove the volatile clusters, and enhance the transport of dopants into the crystalline layer. In plasma doping with higher energy ions, the heated substrate repairs the damage by moving the crystal-amorphous interface closer to the surface of the substrate, increasing the dose of the dopants and sharpening the abruptness of the profile. The implant profile is a function of the temperature of a heated chuck used (not shown) and the temperature of the heated chuck is designated as either Lowest T, High T, and Higher T for differentiation purposes in FIG. 8C and FIG. 8D.

FIG. 8C is an exemplary graph 840 depicting the implant profile before RTA with a pre-amorphization (PA) step. The $10^{22}$ peak dopant concentration 844 and $C_{SAT}$ 842 steps are shown. The pre-amorphization (PA) 816 step is performed to cause an ion range diffusion and results in the amorphization depth 846. The implant profile 852 includes a portion that is a line that goes on an abrupt downward slope, the line terminating close to the end of the dope ion range 848 and radical range 850. As mentioned above, the implant profile 852 labelled (Lowest T 852) is the result of the lowest temperature of the heated chuck. The kink 843 in the implant profile 852 is closer to a substrate surface compared to the prior graphs in FIG. 8A and FIG. 8B. The radicals do not diffuse beyond the damaged region that was brought closer to the surface of the substrate. The implant profile 852 was achieved at a low temperature, greater than room temp but below a temperature where the films of the substrate becomes volatile, typically in the range of 300 to 400 C.

FIG. 8D is an exemplary graph 860 depicting the implant profile after RTA with a pre-amorphization step. The $10^{22}$ peak dopant concentration 864 and $C_{SAT}$ 862 are shown. The pre-amorphization step is performed and results in the amorphization depth 863. There are two implant profiles displayed FIG. 8D. The first implant profile is the High T implant profile 868 and was obtained using a higher range of temperature than the Lowest T 852 generated and displayed in FIG. 8C, for example, greater than 400 degrees C. The High T implant profile 868 resulted in diffusion in the crystalline layer. The result is an implant profile that has a more abrupt transition and where the clusters and deposition layers are gone. The second implant profile is the Higher T implant profile 872, where the temperature range, for example, is greater than 500 degrees C.

The same damageless plasma doping process was used in FIG. 8C but as noted above, the temperature ranges for High T and Higher T are higher. The cap/cover layer (115 in FIG. 1) goes away by sublimation and there is diffusion into the crystalline layer (566 in FIG. 5B). The higher temperature curve "kink" moves closer to the surface because of straggle repair. The dose near the surface of the higher temperature process is lower because of diffusion and loss of dopant due to sublimation from the surface and loss of cap, as displayed in FIG. 8D and labelled as High T 868 and Higher T 872 and further identified as "Diffusion in crystalline layer 870".

Figure 9:
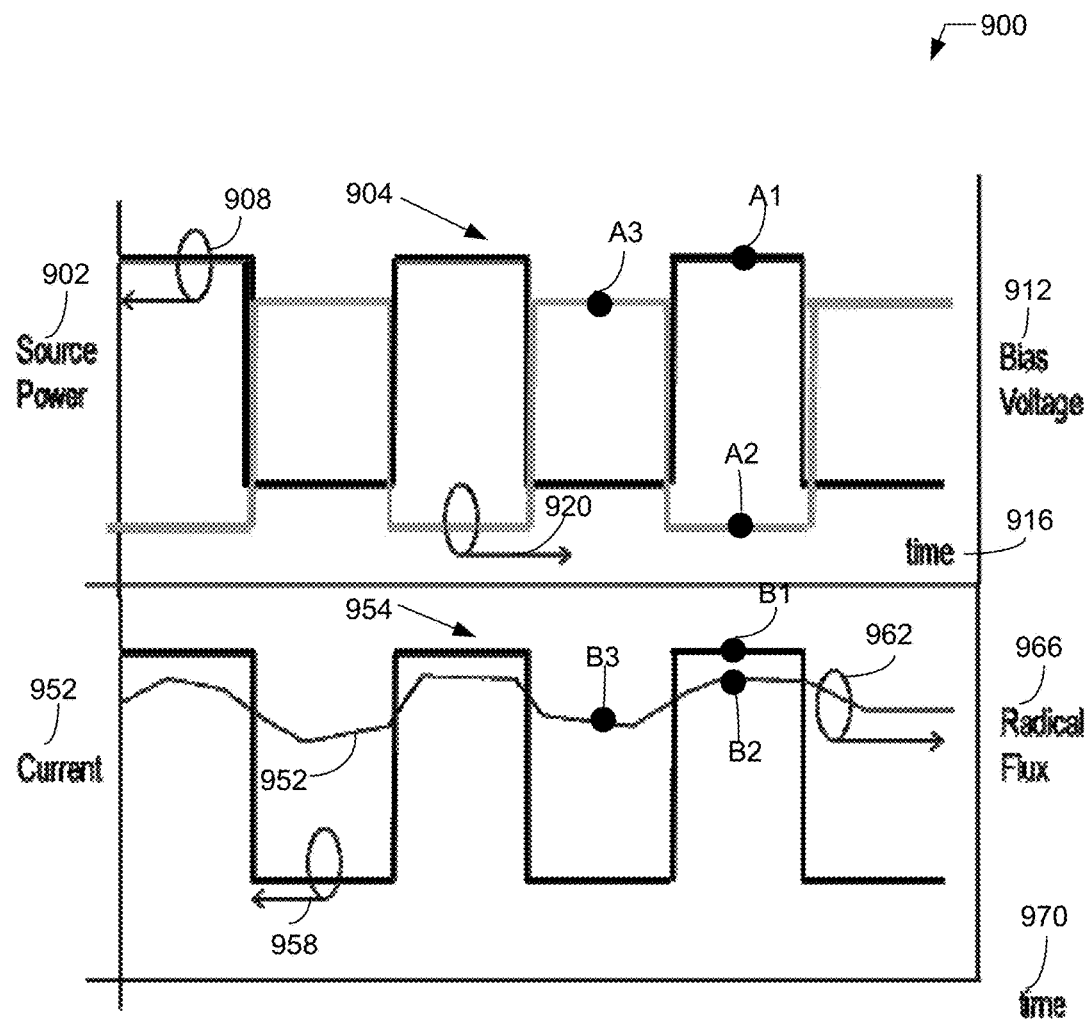
FIG. 9 is an exemplary architectural diagram 900 of source power and bias voltage 904 as a function of time in a processing chamber whereas the current and radical flux 954 depend on the pulsing rate and duty cycle as a function of time in another embodiment of the present invention.

FIG. 9 is an exemplary schematic diagram 900 comprising a top graph 904, indicated by directional arrow 908 to the left Y-axis of the source power 902 and bias voltage 912 indicated by directional arrow 920 to the right Y-axis, as a function of time in a processing chamber and a bottom graph 954 indicated by the directional arrow 958 to the left Y-axis of the current 952 and radical flux 966 indicated by the directional arrow 962 to the right Y-axis, as a function of time. Elements in Group III-Vs and germanium require deep doping (20 nm order). Deep doping requires high energy. Deep doping may be achieved by using a plasma source with low plasma density and high RF bias power. Still, a large radical flux is required for high dose doping. However, high plasma density is also required. Meeting these contradictory needs (or trade-offs) may be achieved by source pulsing a volume-heated plasma so the plasma density varies from high to low density. Asynchronous source and bias pulsing may also be used. The source power can be a surface wave plasma (SWP). In one embodiment, the SWP can be a radial line slot antenna (RLSA™) plasma source or another SWP source. In addition, other source power such as inductively coupled plasma (ICP), electron-cyclotron resonance (ECR), or very high frequency (VHF) capacitively coupled plasma (CCP) could also be used to lesser effect.

Referring to FIG. 9, the top graphs 904 has time 916 in the X-axis, when the source power (microwave or other volume heating mechanism) is high as in point A1, the current to the substrate is high as shown in point B2 and compared to an arbitrary unit reference (not shown), the bias voltage is low as in point A2. When the source power is off at the same bias power, the current to the biased substrate drops as shown in point B3 and the bias voltage increases as shown in point A3 along with ion energy.

The radical flux 952 may or may not drop when the bias voltage drops. The rate of drop of current and radical flux depends on the pulsing rate and duty cycle. This is different than bias pulsing which is in prior art, for example employing direct current DC hollow cathodes. Bias voltage pulsing modulates the ion energy by increasing and decreasing the bias voltage typically at constant source power which is not advantageous because high bias voltage at high ion current leads to undesirable sputtering. Direct current (DC) biased hollow cathodes can be used as sources which are pulsed. However, the implant time period only uses the source power on time rather than the source on off or on low power source time. Direct current (DC) biasing without pulsing is not possible because of charge damage considerations to the substrate.

Source power and bias voltage pulsing have been used for etch process applications. However, the unique need in doping is for a damageless generation of large radical fluxes and the concurrent need for a very low current and high bias voltage phase that can only be accessed by using SWP sources and the configuration as described above.

Figure 10:
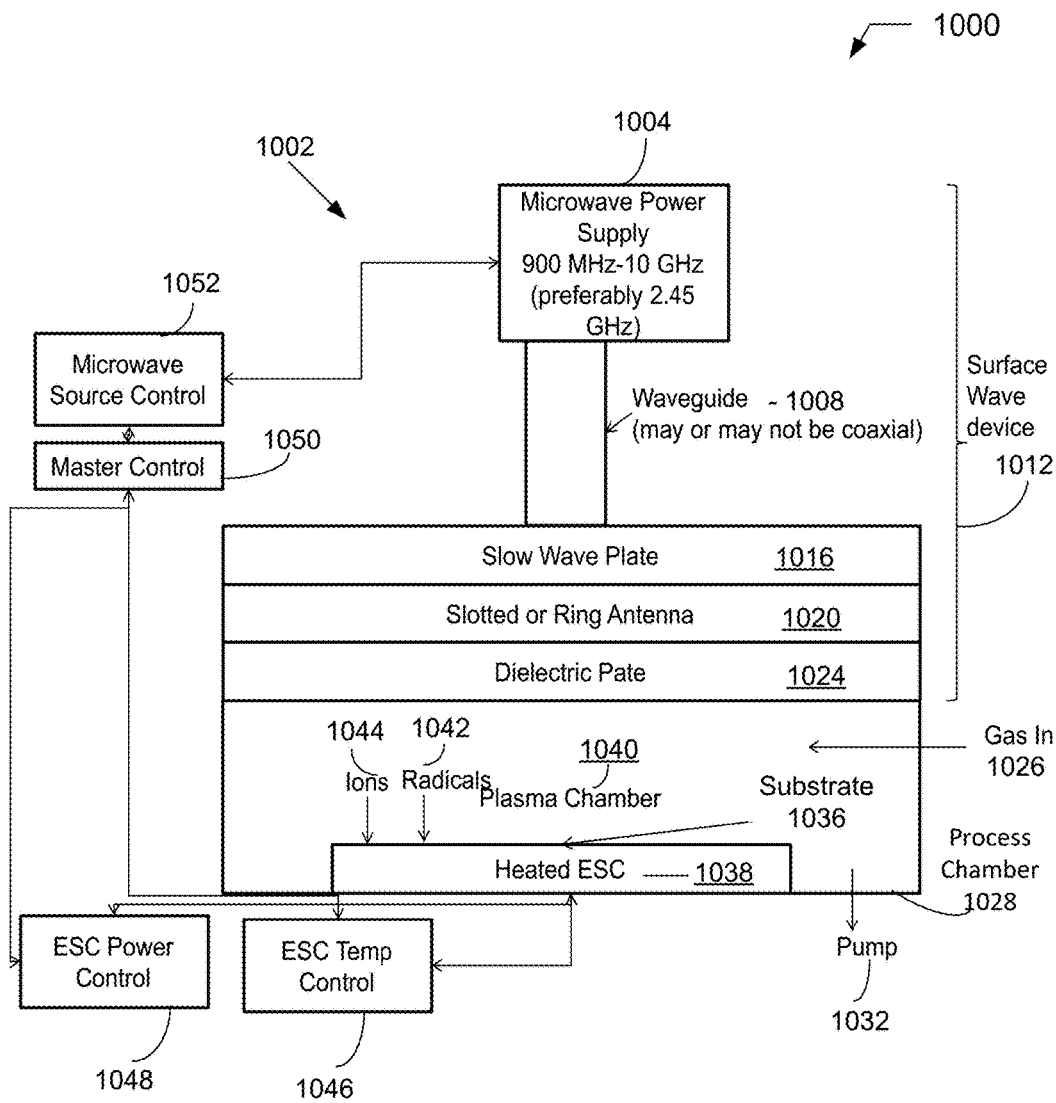
FIG. 10 is an exemplary architectural diagram 1000 of a doping system in an embodiment of the present invention.

FIG. 10 is an exemplary architectural diagram 1000 of a doping system 1002 in an embodiment of the present invention. The doping system comprises surface wave device 1012, process chamber 1028, and several control devices. The surface wave device 1012 comprises a microwave power supply 1004 that can operate in the range from 900 MHz to 10 GHz, preferably 2.45 GHz. The surface wave device 1012 is coupled to a waveguide 1008 that may or may not be coaxial and is coupled to the plasma chamber 1040. The waveguide is further coupled to a slow wave plate 1016, slotted or ring antenna 1020, and a dielectric plate 1024, which are all inside the process chamber 1028. Inside the process chamber 1028 is an electrostatic chuck 1038 that can be heated or cooled. Also coupled to process chamber 1028 is a gas delivery system 1026 and a pump 1032 to create a vacuum or remove gases from the process chamber 1028. The electrostatic chuck (ESC) 1038 can be used as a place where substrate 1036 can be disposed. The process chamber 1028 contains a plasma chamber 1040 where plasma comprising ions 1044 and radicals 1042 are generated. The control devices include microwave source control 1052 coupled to the microwave power supply 1004 and to the master control 1050 which in turn is coupled to an ESC power control 1048 and an ESC temperature control 1046 where both the ESC power control 1048 and the ESC temperature control 1046 are coupled to the ESC 1038.

Figure 11:
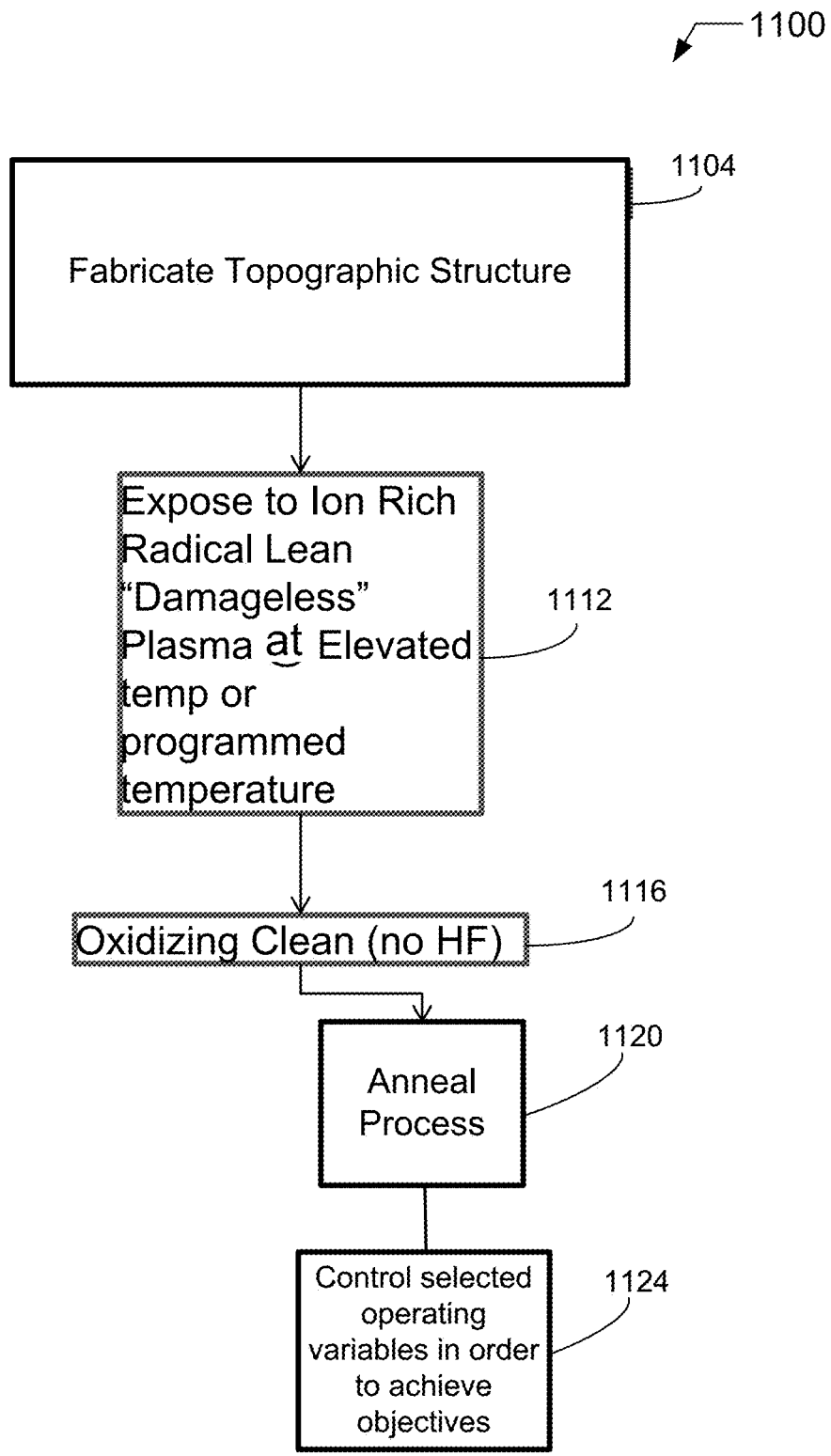
FIG. 11 is an exemplary chart 1100 of a method using a plasma doping system in an embodiment of the present invention.

FIG. 11 is an exemplary chart 1100 of a method using a plasma doping system in an embodiment of the present invention. A step 1104 is performed to fabricate the topographic structure. Depending on the application, step 1104 may include an integration scheme comprising a variety of processes. The step 1104 can include a deposition or removal of one of more layers of film in the substrate. In step 1112, the substrate is exposed to ion rich, radical lean, damageless plasma at elevated temperature or programmed temperature. In step 1116, the substrate is subjected to an oxidizing cleaning step where no HF hydrofluoric acid is used. In step 1120, the substrate is subjected to an anneal process. The anneal process can include a one or more anneal processes based on the needs of the application. In step 1124, selected operating variables are controlled in order to achieve doping objectives.

Figure 12:
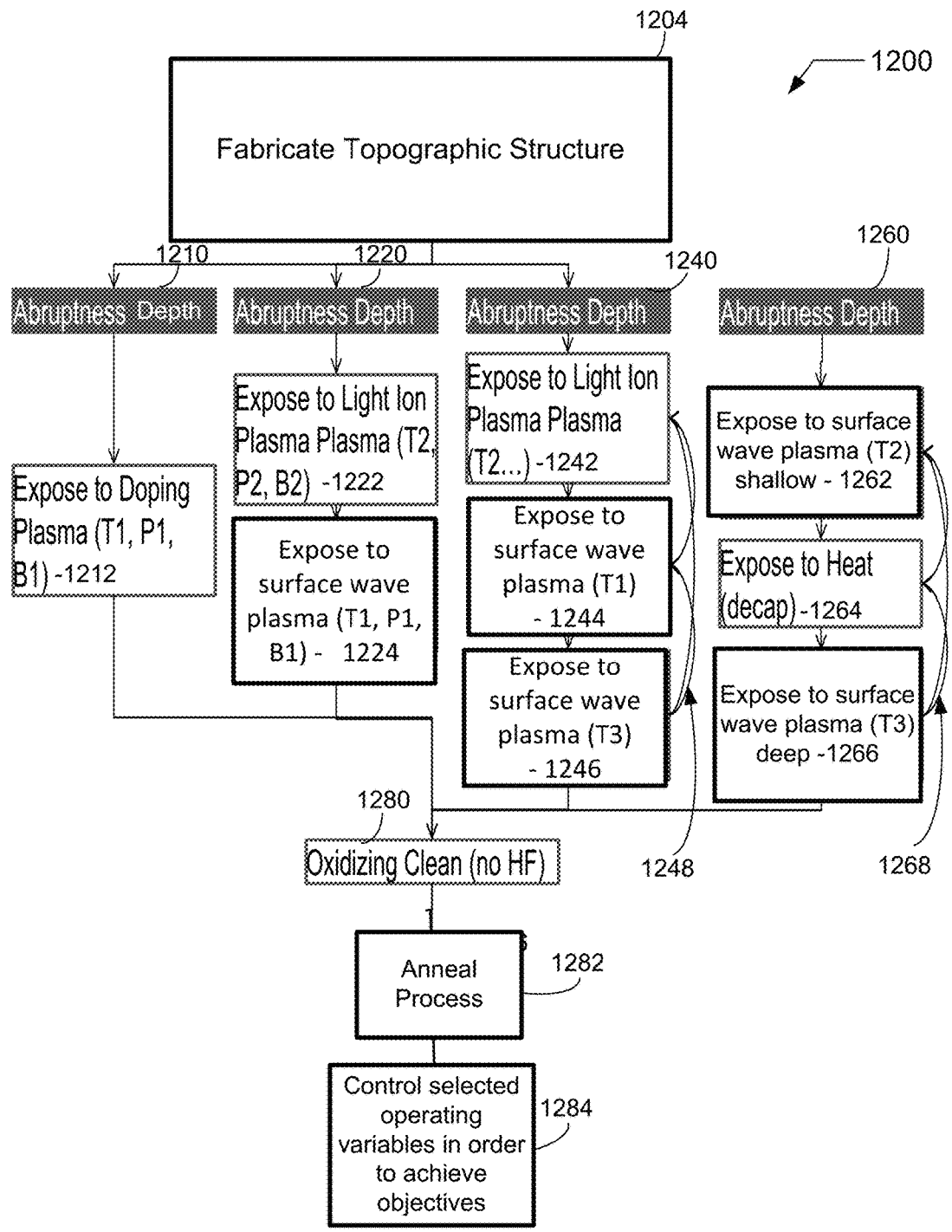
FIG. 12 is an exemplary chart 1200 of different method steps for controlling the plasma doping system in an embodiment of the present invention.

FIG. 12 is an exemplary chart 1200 of different method steps for controlling the plasma doping system in an embodiment of the present invention. A step 1204 to fabrication the topographic structure is performed. Depending on the application, step 1204 may include an integration scheme comprising a variety of processes including a deposition and/or removal of one of more layers of film in the substrate. The next step of doping is abruptness depth control in the doping process which can be performed using one or more of the four alternative embodiments.

Before discussing the detail doping steps, below is a high level description of doping concepts and terms used in this application. Shallow and deep refer to the penetration depth of dopants into the layers of the substrate. A surface wave plasma source is the device to provide low energy ions that produces a shallow penetration depth referred to as "shallow doping". During doping, a volatile layer or cap is formed on the substrate. Heat applied to the substrate removes the cap or decap the surface of a pattern on the substrate. The cap is often thick enough to prevent ion penetration, so there is a need to decap or open the pattern on the substrate so that new ions can be inserted more deeply. With the use of light ions, higher energy, and low current, a deeper penetration depth can be achieved, a process also known as "deep doping".

Conventionally, high temperature anneal repairs lattice damage and activates dopants. High temperature anneal is done after conventional doping such as in implant or plasma doping where diffusion effects controlling of the doping profiles. In another embodiment, in-situ repair of deep damage during doping slows the deepest transport and manages the abruptness of the profile.

Amorphization depth is a function of the ion energy at a given depth. Ions above 14 eV for example can break Si—Si bonds so that these do not re-bond. This will be essentially the "ion" penetration depth. The minimum amorphization depth (caused by ions) is 1 atom thickness or about 0.2 nm as ions with zero energy gobble electrons from the lattice and create defects on a surface.

Damage density (#/cm$^3$) can be anything from zero to about $10^{22}$ cm$^{-3}$. A low value is less than ~$10^{10}$ cm$^{-3}$. Transition abruptness is the dopant density gradient. An upper limit or perfect abruptness would be alpha multiplied by $10^{22}$ cm$^{-3}$/0.2 nm. Alpha is the fraction of the atoms in the layer that are dopants. $10^{22}$ cm$^{-3}$ is the density of a solid and alpha multiplied by that number is the saturation dose $C_{sat}$. The saturation dose is the maximum dopant fraction one can infuse in a solid. The saturation dose depends on the substrate temperature and the properties of the film.

The first embodiment 1210 of doping abruptness depth control has a single step 1212 for exposing the substrate to doping plasma at a first temperature T1, a first source power P1, and a first bias power B1. The first temperature T1 can be in the range from 40 to 1,000 degrees C. preferably 40-150 C; the first source power can be in the range from 1000 to 5000 Watts; and the first bias power can be in the range from 50 to 500 Watts.

The second embodiment 1220 comprises steps 1222 and 1224. Step 1222 includes exposing the substrate to a light ion plasma where the light ion plasma is at temperature T2, a source power P2, and bias power B2. The second temperature T2 can be in the range from 30 to 1,000 degrees C. preferably 30 C; the second source power P2 can be in the range from 5,000 to 10,000 W preferably 10,000 W; and the second bias power B2 can be in the range from 500 to 1,500 W preferably 1000 W. Step 1224 includes exposing the substrate to a surface wave plasma at a first temperature T1, a pressure P1, and a bias voltage B1. The first temperature T1 can be in the range from 150 to 1,000 degrees C. preferably 300 C; the first source power P1 can be in the range from 2,500 to 7,500 W preferably 5,000 W; and the first bias power B1 can be in the range from zero to 300 Watts preferably 100 Watts.

The third embodiment 1240 comprises steps 1242, 1244, and 1246. Step 1242 includes exposing the substrate to a light ion plasma where the light ion plasma is at temperature T2. The temperature T2 can be in the range from 30 to 1,000 degrees C. preferably 30 degrees C. Step 1244 includes exposing the substrate to a surface wave plasma at a temperature T1. The temperature T1 can be in the range from 30 to 1,000 degrees C. preferably 30 degrees C. Step 1246 includes exposing the substrate to a surface wave plasma at a temperature T3. The temperature T3 can be in the range from 30 to 1,000 degrees C. preferably 300 C. As indicated for the third embodiment 1240, the previous steps 1248 can be repeated one or more times depending: (a) on requirements of the application, (b) on empirical data collected in tests, and/or (c) on measurements using sensors, monitoring devices, probes, and/or optical metrology devices. The empirical data from tests or collected measurement data are used to determine the number of times the steps 1242, 1244, and/or 1246 are repeated in order to get the target abruptness depth.

The fourth embodiment 1260 comprises steps 1262 and 1264, and 1266. Step 1262 includes exposing the substrate to surface wave plasma where the plasma is at temperature T2. The temperature T2 can be in the range from 30 to 1,000 degrees C. Step 1264 includes exposing the substrate to heat at a decap temperature. During the doping process, a cap can be formed on a substrate where the cap comprises a volatile layer of material. The process of removing the cap is called decapping which is done at a range of temperatures known as decap temperature.

Step 1266 includes exposing the substrate to a surface wave plasma at a temperature T3. The temperature T3 can be in the range from 150 to 1,000 degrees C. preferably 300 C. As indicated for the fourth embodiment 1260, the previous steps 1268 can be repeated one or more times depending: (a) on requirements of the application, (b) on empirical data collected in tests, and/or (c) on measurements using sensors, monitoring devices, probes, and/or optical metrology devices. The empirical data from tests or collected measurement data are used to determine the number of times the steps 1262, 1264, and/or 1266 are repeated in order to get the target abruptness depth.

In step 1280, the substrate is subjected to an oxidizing cleaning where no fluorine containing gas such as HF is used. In step 1282, the substrate is subjected to an anneal process. The anneal process can include one or more anneal processes based on the needs of the application. Those who are knowledgeable in the art of doping processes are familiar with the anneal processes used after the doping steps and shall not be repeated here.

In step 1284, selected operating variables are controlled in order to achieve doping objectives. As mentioned above, the operating variables of the plasma doping system can include pressure in the process chamber, ion flux, damage density, penetration depth, sputter rate, density of the substrate, amorphization depth, ion energy, and/or temperature of the substrate. Other operating variables may be identified during testing of design of experiments that can be added to the list of operating variables. Doping objectives can include a target damage density, target amorphization depth, and target transition abruptness.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

The invention claimed is:

1. A method of controlling doping of a substrate, the method comprising:
   providing the substrate in a process chamber of a doping system;
   performing a doping process to impart a target dose on a surface of the substrate using an abruptness depth control technique that includes exposing the substrate to at least one of (i) a plasma at one or more predetermined temperatures, (ii) one or more predetermined source powers including at least one of a first source power and a second source power, (iii) one or more predetermined concentrations of dopant radicals, and (iv) one or more predetermined bias powers including at least one of a first bias power and a second bias power; and
   controlling selected operating variables of plasma doping in order to meet doping objectives;
   wherein performing the doping process further comprises:
      exposing the substrate to light ion plasma, wherein the exposure to the light ion plasma is performed at the second source power and the second bias power; and
      exposing the substrate to a surface wave plasma, wherein the exposure to the surface wave plasma is performed at the first source power and the first bias power;
      wherein the second source power is less than the first source power, and the second bias power is less than the first bias power.

2. The method of claim 1 wherein the doping objectives include a target damage density, target amorphization depth, and target transition abruptness.

3. The method of claim 2 wherein:
   the one or more predetermined temperatures includes at least one of a first temperature is in a range from 30° C. to 1,000° C., a second temperature is in a range from 30° C. to 1,000° C., a third temperature is in a range from 30° C. to 1000° C.;
   the one or more source powers includes at least one of a first source power in a range from 1,000 to 10,000 W and a second source power is in a range from 1,000 to 10,000 W;
   the one or more predetermined concentration of dopant radicals includes at least one of a first concentration of dopant radicals in a range of $10^{18}$ cm−3 to $10^{22}$ cm−3 and a second concentration of dopant radicals in a range of $10^{18}$ cm−3 to $10^{22}$ cm−3; and
   the predetermined bias power is in a range from zero to 500 W.

4. The method of claim 3,
   wherein the exposure to the light ion plasma is performed at the second temperature, a second pressure, and the second concentration of dopant radicals; and
   wherein the exposing the substrate to the surface wave plasma is performed at the first temperature, a first pressure, and the first concentration of dopant radicals.

5. The method of claim 4 wherein:
   a combination of exposing the substrate to light ion plasma at the second temperature, exposing the substrate to surface wave plasma at the first temperature, and exposing the substrate to surface wave plasma at the first temperature is iterated until the doping objectives are reached.

6. The method of claim 3 further comprises:
   performing an oxidizing clean process on the substrate;
   performing an annealing process on the substrate; and
   controlling selected operating variables of the oxidizing clean process and the annealing process in order to meet doping objectives;
   wherein the annealing process further comprises performing a first anneal process or a first anneal process followed by a second anneal process.

7. The method of claim 6 wherein:
   performing a pre-amorphization process configured to impart a deep dose on a surface of the substrate by facilitating diffusion of radicals with low enough current so that the surface of the substrate is not sputtered prior to performing the doping process to impart the target dose on the surface of the substrate using the abruptness depth control technique.

8. The method of claim 7 wherein a source power of the doping system is an inductively coupled plasma (ICP), an electron-cyclotron resonance (ECR), or a very high frequency (VHF) capacitively coupled plasma (CCP).

9. The method of claim 7 wherein annealing of the substrate comprises application of heat to the substrate using an electrically self-biased heated electrostatic chuck, microwave radiation exposure, light emitting diodes or flash lamps.

10. The method of claim 7 wherein heating of the substrate is pulsed and a rate of drop of current and radical flux generated for the doping system depend on the pulsing rate and duty cycle.

11. The method of claim 7 wherein the heated electrostatic chuck is operated at a temperature above a sublimation or decomposition temperature of a material in a saturation layer of the substrate.

12. The method of claim 7 wherein controlling the temperature and additives to the saturation layer of the substrate for a high dose conformal low damage doping process.

13. The method of claim 7 wherein the doping process includes selective removal of a surface layer that further comprises:
   amorphization of a surface of a layer of the substrate;
   infusing radicals into the process chamber which render the layer volatile when heated; and
   removing the layer in a flash heating step using a substrate heater or a flash lamp.

14. The method of claim 7 wherein the oxidizing clean process comprises removing a subsequent layer of the substrate with a wet clean.

15. The method of claim 4 wherein the light ion plasma comprises helium or argon ions and the doping radicals comprises P, As, or B derived from PH3, AsH3, and BH3 respectively.

16. The method of claim 7 wherein operating variables of the plasma doping system include pressure in the process chamber, ion flux, damage density, penetration depth, sputter rate, density of the substrate, amorphization depth, ion energy, and/or temperature of the substrate.

17. The method of claim 1, wherein the light ion plasma is configured to impart the target dose at a deeper penetration depth into the surface of the substrate than the surface wave plasma.

\* \* \* \* \*